US009472700B2

(12) United States Patent
Richards et al.

(10) Patent No.: US 9,472,700 B2
(45) Date of Patent: Oct. 18, 2016

(54) SOLAR CELL ASSEMBLY

(71) Applicant: SolAero Technologies Corp., Albuquerque, NM (US)

(72) Inventors: Benjamin C Richards, Albuquerque, NM (US); Charles F Sarver, Tijeras, NM (US); Maria Naidenkova, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/163,080

(22) Filed: May 24, 2016

(65) Prior Publication Data
US 2016/0268463 A1    Sep. 15, 2016

Related U.S. Application Data

(63) Continuation-in-part of application No. 14/224,212, filed on Mar. 25, 2014, now Pat. No. 9,379,274.

(51) Int. Cl.
H01L 31/05      (2014.01)
H01L 31/048     (2014.01)
H01L 31/0304    (2006.01)

(52) U.S. Cl.
CPC ..... H01L 31/0481 (2013.01); H01L 31/03046 (2013.01)

(58) Field of Classification Search
None
See application file for complete search history.

(56) References Cited

U.S. PATENT DOCUMENTS

| 9,379,274 B1 * | 6/2016 | Richards ............... H01L 31/048 |
| 2004/0036993 A1 | 2/2004 | Tin |
| 2012/0222723 A1 | 9/2012 | Mayer et al. |

* cited by examiner

*Primary Examiner* — Seahvosh Nikmanesh

(57) ABSTRACT

A solar cell assembly including: a solar cell for generating electric power from sunlight; a cover glass for covering the solar cell; transparent shims, which are disposed between the solar cell and the cover glass at the points were the distance between the solar cell and the cover glass needs to be controlled, and form a space between the solar cell and the cover glass; and a transparent adhesive layer, which fills the space between the solar cell and the cover glass and has the thickness the same as that of the transparent shims.

8 Claims, 6 Drawing Sheets

SOLAR CELL ASSEMBLY

REFERENCE TO RELATED APPLICATIONS

This application is a continuation-in-part of U.S. patent application Ser. No. 14/224,212, filed Mar. 25, 2014, now U.S. Pat. No. 9,379,274 B1.

BACKGROUND OF THE DISCLOSURE.

1. Field of the Disclosure

The present disclosure relates to the field of photovoltaic solar cell assemblies and arrays, and more particularly to multijunction solar cells based on III-V semiconductor compounds fabricated into interconnected Cell-Interconnect-Cover Glass (CIC) assemblies.

2. Description of the Related Art

In the prior art, a solar cell assembly normally comprises a solar cell for generating power from solar radiation, a cover glass for optical filtering and protecting the solar cells from external influences, such as radiation, air, dust or water, and adhesive layer for binding the cover glass to the solar cell and forming air-tight/liquid-tight seal therebetween. The term "panel" as used herein refers to any type of supporting or mounting member, whether flexible or rigid. In the usage of those in the field of solar cell panel design and fabrication, some may refer to a "panel" as a "substrate." However, such usage should be distinguished from the usage of "substrate" in the semiconductor field in which "substrate" usually refers to bulk semiconductor material. Optionally, the solar cell panel has other components, such as bypass and blocking diodes, and interconnects for controlling the interconnection of groups of solar cells, a accumulator or power distribution hub for accumulating the power output from the individual or groups of solar cells, or a honeycomb member for supporting and strengthening the structure. The solar cell comprises thin-film semiconductor device with electrical terminals on the front and/or back side of the semiconductor substrate. Optionally, a plurality of solar cells can be disposed and interconnected as an array via wire and diodes, such that the area and the output voltage of the solar cell panel can be enlarged.

In prior art, when attaching the cover glass to the solar cell, opaque mechanical shims are used to support the cover glass on the solar cell, and then the adhesive layer is disposed between the solar cell and the coverglass, such that the thickness of the adhesive layer is determined by the opaque shims.

However, after the adhesive is cured, the opaque shims have to be removed. The disadvantages of this technique are that (a) removing the opaque shims was tedious and time consuming, and required back-filling the voids with fresh adhesive; (b) removing the opaque shims was mechanically disruptive and often damaged the solar cell panels by cracking the corners, resulting in scrapping those parts.

Thus, a solar cell assembly and the method for manufacturing such solar cell panel, which can overcome the above disadvantages, are needed in the art.

SUMMARY

According to an aspect of an embodiment of the present disclosure, there is provided a solar cell assembly, comprising: a solar cell for generating electric power from sunlight; a cover glass for covering the solar cell; transparent shims, which are disposed between the solar cell and the cover glass at the points where the distance between the solar cell and the cover glass needs to be controlled, and form a space between the solar cell and the cover glass; and a transparent adhesive layer, which fills the space between the solar cell and the cover glass and has the thickness the same as that of the transparent shims.

By using the transparent shims, the transparent adhesive layer of the controlled thickness can be attained in one processing step, and it is not necessary to remove the transparent shims after the adhesive is cured, thereby facilitating the manufacturing of the solar cell panel.

Further aspects, features and advantages of the present disclosure will be understood from the following description with reference to the drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
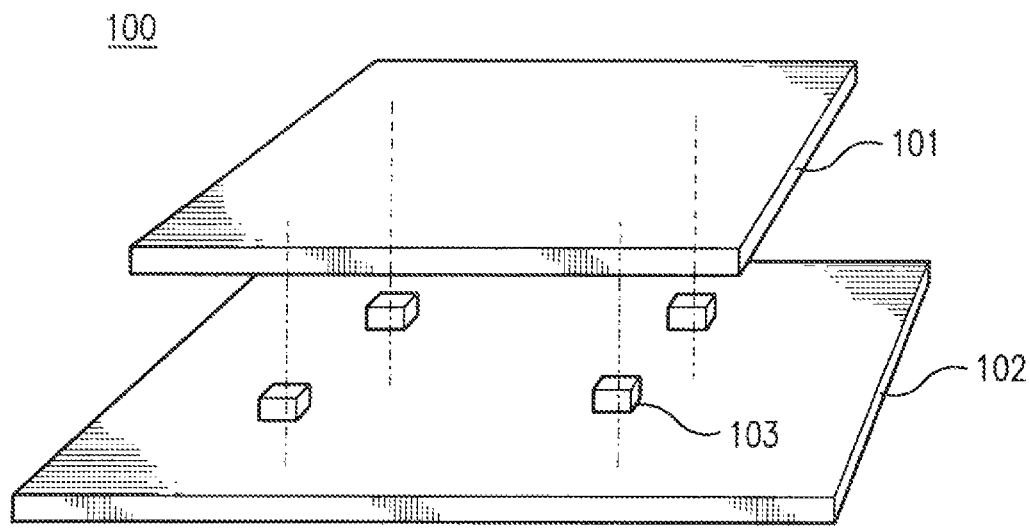
FIG. 1 is a simplified exploded view schematically illustrating a solar cell panel according to an embodiment of the present disclosure, in which the adhesive layer is omitted for clarity.

Embodiments of the present disclosure will be described in detail below with reference to the drawings. Note that similar reference numerals are used to refer to similar elements throughout the drawings, and thus repetitive descriptions thereof are omitted.

Figure 2:
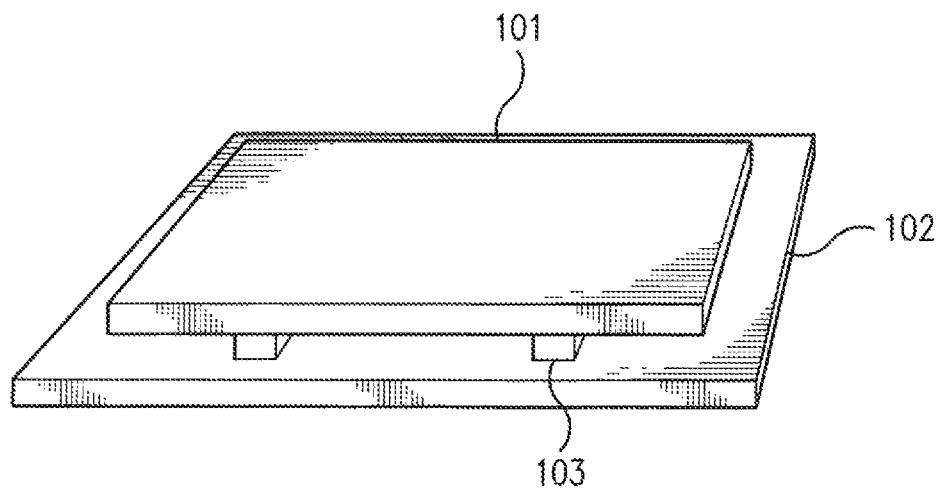
FIG. 2 is a simplified perspective view schematically illustrating a solar cell panel according to an embodiment of the present disclosure, in which the adhesive layer is omitted for clarity.

FIG. 1 is a simplified exploded view schematically illustrating a solar cell assembly according to an embodiment of the present disclosure. FIG. 2 is a simplified perspective view schematically illustrating a solar cell assembly according to an embodiment of the present disclosure.

The solar cell panel 100 includes a solar cell 101 for generating electric power from sunlight, a cover glass 102 for covering the solar cell, transparent shims 103 for supporting the cover glass 102 on the solar cell 101 and an adhesive layer for bonding and encapsulating the solar cell panel 100. The transparent shims 103 are disposed between the solar cell 101 and the cover glass 102 at the points where the distance between the solar cell 101 and the cover glass 102 needs to be controlled, and therefore form a space between the solar cell 101 and the cover glass 102 when they are combined. The adhesive layer fills the space between the solar cell 101 and the cover glass 102 and has the thickness the same as that of the transparent shims 103. The adhesive layer can be made of an optically transparent adhesive (for example, Nusil CV-2500) or an encapsulant (for example, Dow Corning DC93-500). For clarity, the adhesive layer is omitted in FIGS. 1 and 2.

In some embodiments, the solar cell is a III-V compound semiconductor multijunction solar cell.

Figure 3:
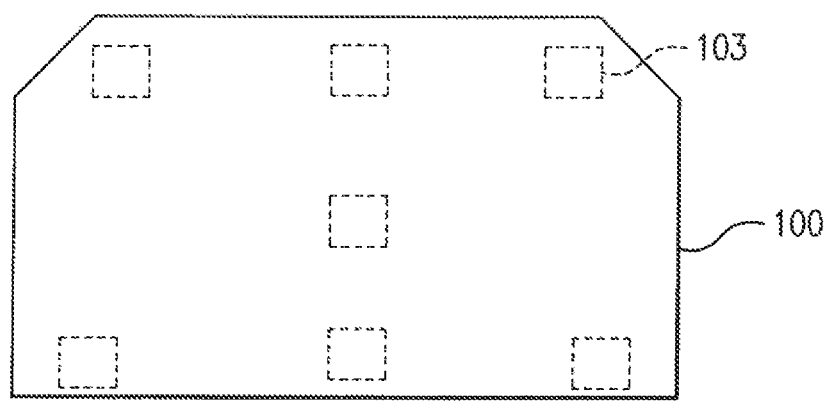
FIG. 3 is a simplified to view schematically illustrating the position of the transparent shims relative to the solar cell panel according to an embodiment of the present disclosure.

FIG. 3 is a simplified top view schematically illustrating the positions of the transparent shims relative to the solar cell panel. The solid line shows the outline of a possible solar cell panel 100, and the dotted squares show the outline and possible positions of seven transparent shims 103. These shims of transparent material should be placed onto the solar cell assembly at the points where the bond line thickness needs to be controlled. They can be placed in the corners, or along the edges, or in the middle, or anywhere that the bond line thickness needs to be controlled. The shape and size of the solar cell assembly, and the size, the shape and the locations of the transparent shims are merely for illustration. In one embodiment, the shims may be approximately 2 mm ×2 mm squares, with the thickness of about 8 mil.

In one or more embodiments, the size of the shims are in the range of 1 to 5 mm on a side.

In one or more embodiments, the thickness of the shim is between 2 and 12 mils.

In one or more embodiments, the

With the above configuration, the thickness of the adhesive layer can be controlled by the thickness of the transparent shims 103, and it is not necessary to remove the transparent shims 103 after the adhesive is cured, thereby facilitating the manufacturing of the solar cell assembly 100.

Figure 4:
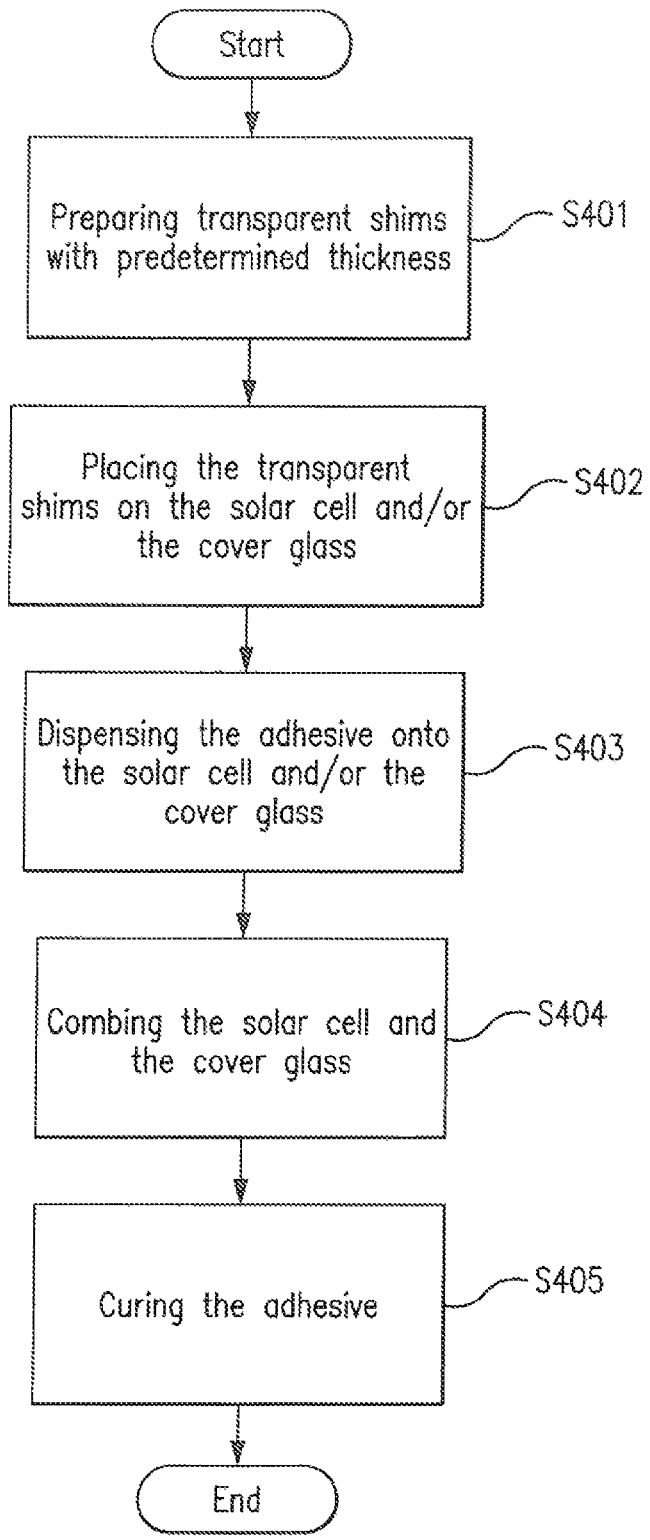
FIG. 4 is an exemplary flow chart of method for manufacturing the solar cell panel according to an embodiment of the present disclosure.

FIG. 4 is an exemplary flow chart of method for manufacturing the solar cell panel according to an embodiment of the present disclosure.

At step S401, transparent shims 103 with predetermined thickness are prepared. In some embodiments, the transparent shims are prepared in advance and stored for later use. The process for preparing the transparent shims will be described in detail latter.

At step S402, the transparent shims 103 are placed on the solar cell 101 and/or the cover glass 102, at the points where the distance between the solar cell 101 and the cover glass 102 needs to be controlled. In some embodiment, the transparent shims are placed on the solar cell, or on the coverglass, or on both of them The transparent shims can be wetted with the adhesive In advance, in order to reduce the formation of bubbles.

At step S403, an adhesive is dispensed onto the solar cell 101 and/or the cover glass 102. Based on the requirement on hand, the adhesive can be dispensed on either one or both the solar cell 101 and the cover glass 102, which may or may not have transparent shims disposed on them yet. The step S403 can be carried out before, after or in parallel with the step S402. The adhesive can be de-gassed before being dispensed.

At step S404 the solar cell 101 and/or the cover glass 102 are combined, such that in the combined structure, the transparent shims 103 and the adhesive are sandwiched between the solar cell 101 and the cover glass 102 and the thickness of the adhesive layer is the same as that of the transparent shims 103. In order to ensure the thickness of the adhesive layer, weight can be placed on top of the combined structure, to ensure that the adhesive levels out to the desired thickness. In some embodiments, by injecting the adhesive into the space formed by the solar cell 101, the cover glass 102 and the transparent, shims 103, the step S403 can be carried out step S404.

At step 405, the adhesive is cured, and then the process ends. The adhesive can be thermosetting or thermoplastic adhesive. In the case of thermosetting adhesive, the combined structure is disposed in an oven for example at 70° C. for 30 minutes, to allow the adhesive to cure, and then is removed from the oven. The adhesive can be pre-cured in an oven for example at 70° C. for 3 minutes, to the extent that the solar cell 101 and the cover glass 102 remain movable with respect to each other, and then the alignment between the solar cell 101 and the cover glass 102 can he verified and adjusted.

Based on the above process, the solar cell panel according to the embodiments of the present invention is manufactured.

The transparent shims can be prepared in many ways. Below, the example of the process of preparing the transparent shims is described with reference to FIG. 5.

Figure 5:
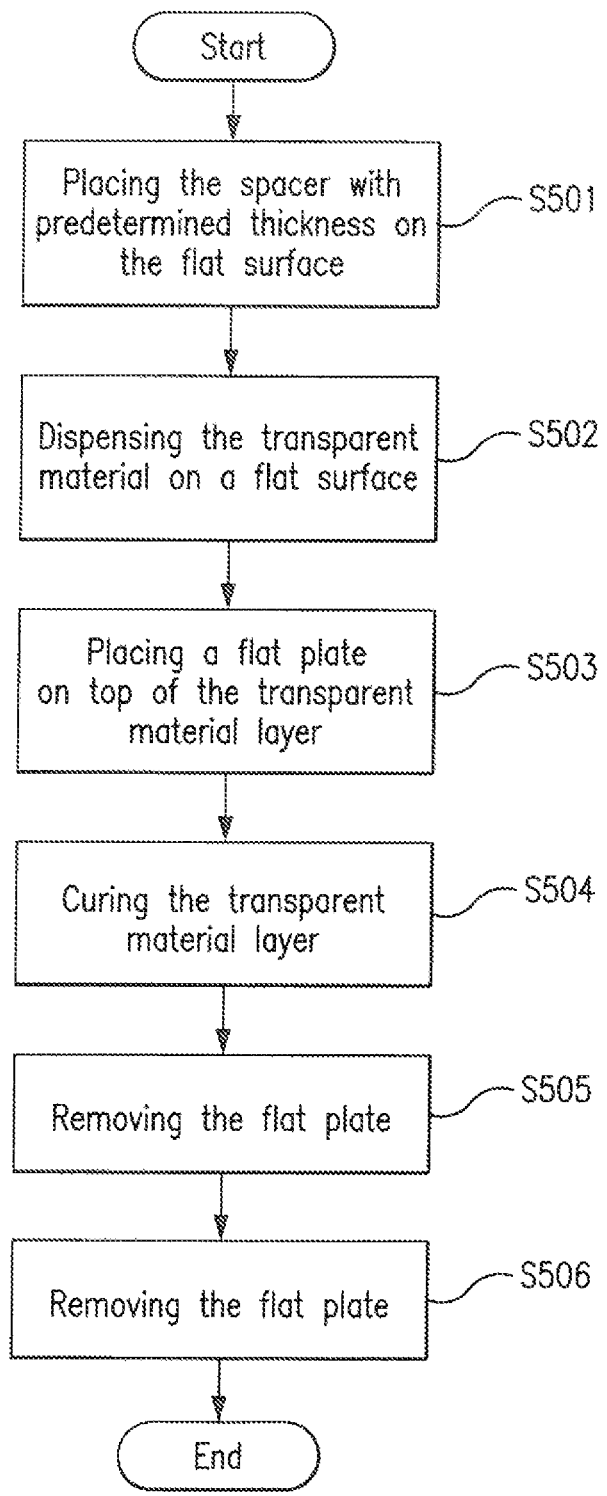
FIG. 5 is an exemplary flow chart of method for manufacturing the transparent shims according to an embodiment of the present disclosure.

FIG. 5 is an exemplary flow chart if method for manufacturing the transparent shims. At step S501, spacers with predetermined thickness are placed on a flat surface at desired place. At step S502, transparent material is dispensed on a flat surface, such that the transparent material may flow around the spacers. At step S503 a flat plate is placed on top of the transparent material layer, such that the thickness of the transparent material layer is the same as that of the spacers. At step S504, the transparent material layer is cured. At step S505, the flat plate is removed. At step S506, the transparent material layer is cut into the transparent shims, and the process ends. In some embodiments the flat surface and the flat plate can be microscope slides. The order of the steps of S501 and S502 an be interchanged, if it is necessary.

Below, another example of the process of preparing the transparent shims is described with reference to FIGS. 6 and 7.

Figure 6:
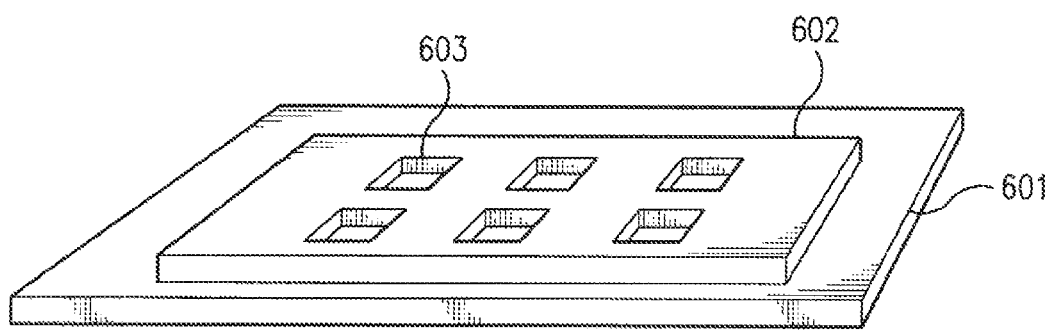
FIG. 6 is a simplified perspective view illustrating the mask for manufacturing the transparent shims according to an embodiment of the present disclosure.
Figure 7:
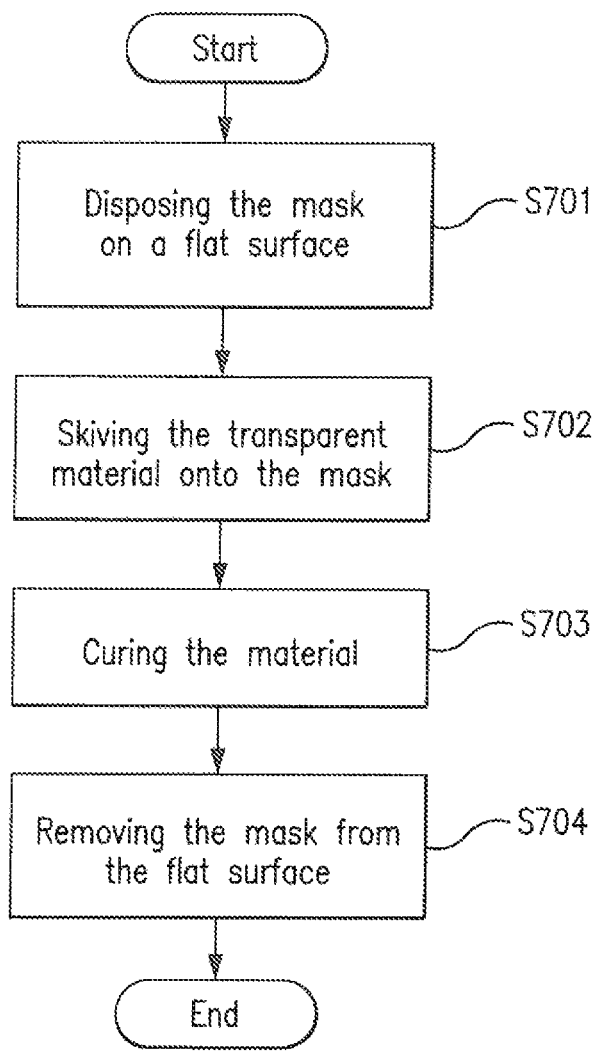
FIG. 7 is another exemplary flow chart of method for manufacturing the transparent shims according to an embodiment of the present disclosure.

FIG. 6 shows the case in which a mask 602 is disposed on a flat surface 601. In the mask 602, through holes 603, which define the shape and the thickness of the transparent shims, are formed. FIG. 7 is another exemplary flow chart of method for manufacturing the transparent shims. As shown in FIG. 7, the transparent shims are formed in the following steps: At step S701, the mask 602 is disposed on the flat surface 601, at step S702, the transparent material is skived onto the mask 602; at step S703, the transparent material is cured, and at the step S704, the mask 602 is removed from the flat surface 601.

It is appreciated that the transparent shims can be prepared in a variety of ways, and the specification merely disclosed some of its examples.

The present invention can be embodied in various ways. The above described orders of the steps for the methods are only intended to be illustrative, and the steps of the methods of the present disclosure are not limited to the above specifically described orders unless otherwise specifically stated. Furthermore, those skilled in the art will recognize that boundaries between the above described operations merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

Note that the embodiments of the present disclosure can be freely combined with each other without departing from the spirit and scope of the invention. It should be understood that the above embodiments can be modified without departing from the scope and spirit of the present invention which are to be defined by the attached claims.

The invention claimed is:

1. A solar cell assembly, comprising:
   a solar cell for generating electric power from sunlight;
   a cover glass for covering the solar cell;
   transparent shims, which are disposed between the solar cell and the cover glass at the points where the distance between the solar cell and the cover glass needs to be controlled, and form a space between the solar cell and the coverglass; and
   an optically transparent adhesive layer, which fills the space between the solar cell and the cover glass and has the thickness the same as that of the transparent shims.

2. A solar cell assembly of claim 1, wherein the size of the transparent shims is in the range of 1 to 5 mm on a side.

3. A solar cell assembly of claim 1, wherein the thickness of the transparent shim is in the range of 2 to 12 mils.

4. A solar cell assembly of claim 1, wherein the transparent shims are disposed at the corners of the solar cell assembly, or along the edges of the solar cell panel.

5. A solar cell assembly of claim 1, wherein the transparent shims are disposed at the corners of the solar cell assembly, or along the edges of the solar cell panel.

6. A solar cell assembly of claim 1, wherein the adhesive layer is composed of a silicone encapsulant.

7. A solar cell assembly as defined in claim 1, wherein the solar cell is a multliunction solar cell that includes an upper first subcell composed of indium gallium phosphide; a second solar subcell is disposed adjacent to and lattice matched to said upper first subcell, the second solar subcell including an emitter layer composed of indium gallium phosphide, and a base layer composed of indium gallium arsenide that is lattice matched to the emitter layer; and a lower subcell that is lattice matched to said second subcell and is composed of germanium.

8. A solar cell assembly as defined in claim 1, wherein the solar cell assembly is a CIC (Cover Glass-Interconneet-Solar Cell) assembly.

* * * * *